United States Patent
Ohno et al.

(10) Patent No.: US 9,824,911 B2
(45) Date of Patent: Nov. 21, 2017

(54) SUBSTRATE SUPPORT AND SEMICONDUCTOR MANUFACTURING APPARATUS

(71) Applicants: Akihito Ohno, Tokyo (JP); Zempei Kawazu, Tokyo (JP)

(72) Inventors: Akihito Ohno, Tokyo (JP); Zempei Kawazu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 554 days.

(21) Appl. No.: 13/785,134

(22) Filed: Mar. 5, 2013

(65) Prior Publication Data

US 2013/0327274 A1    Dec. 12, 2013

(30) Foreign Application Priority Data

Jun. 7, 2012    (JP) .................. 2012-129717

(51) Int. Cl.
*H01L 21/683*    (2006.01)
*H01L 21/687*    (2006.01)

(52) U.S. Cl.
CPC .... *H01L 21/6835* (2013.01); *H01L 21/68757* (2013.01)

(58) Field of Classification Search
CPC ..... C04B 41/5057; C04B 41/52; C04B 41/87; C04B 41/89; C04B 41/4556; C23C 16/045; C23C 16/32; C30B 29/36; H01L 21/68757; H01L 21/6835
See application file for complete search history.

(56) References Cited

U.S. PATENT DOCUMENTS

| 5,283,109 A | * | 2/1994 | Kaplan | C23C 16/325 428/212 |
| 6,740,167 B1 | * | 5/2004 | Rupp | C30B 25/02 118/715 |
| 2007/0062455 A1 | * | 3/2007 | Saxler | C23C 14/505 118/730 |

(Continued)

FOREIGN PATENT DOCUMENTS

| JP | 08191096 A | * | 7/1996 |
| JP | 2006-41358 A | | 2/2006 |
| JP | 2006-60195 A | | 3/2006 |

(Continued)

OTHER PUBLICATIONS

State Intellectual Property Office of the People's Republic of China; Office Action in corresponding Chinese Patent Application No. 201310222922.2 dated (Mar. 27, 2015).

(Continued)

*Primary Examiner* — Yuechuan Yu
(74) *Attorney, Agent, or Firm* — Leydig, Voit & Mayer

(57) ABSTRACT

A substrate support for supporting a substrate when forming a film on a surface of the substrate by chemical vapor deposition. The substrate support includes a graphite material having a recessed portion for accommodating the substrate, a multilayer film on the recessed portion and consisting of a first degassing prevention film of SiC and a sublimation prevention film of TaC or HfC stacked together, and a second degassing prevention film of SiC located on portions of the graphite material other than the recessed portion.

3 Claims, 4 Drawing Sheets

(56) References Cited

U.S. PATENT DOCUMENTS

2008/0035632 A1    2/2008  Fujita et al.

FOREIGN PATENT DOCUMENTS

| | | |
|---|---|---|
| JP | 2008-270682 A | 11/2008 |
| JP | 2009-190916 A | 8/2009 |
| JP | 2009-252969 A | 10/2009 |
| JP | 2011-195346 A | 10/2011 |

OTHER PUBLICATIONS

State Intellectual Property Office of the People's Republic of China; Office Action in corresponding Chinese Patent Application No. 201310222922.2 dated (Oct. 24, 2016).
State Intellectual Property Office of the People's Republic of China; Office Action in Chinese Patent Application No. 201310222922.2 dated (May 5, 2016).
State Intellectual Property Office of the People's Republic of China, Office Action in Chinese Patent Application No. 201310222922.2 dated (Nov. 10, 2015).

* cited by examiner

SUBSTRATE SUPPORT AND SEMICONDUCTOR MANUFACTURING APPARATUS

BACKGROUND OF THE INVENTION

Field of the Invention

The present invention relates to substrate supports such as susceptors and substrate holders for use in chemical vapor deposition apparatuses for forming a film on the surface of a substrate (e.g., by subjecting reactive gas to reaction). The invention also relates to a semiconductor manufacturing apparatus provided with such a substrate support.

Background Art

Japanese Laid-Open Patent Publication No. 2006-60195 discloses a substrate support for supporting a substrate during chemical vapor deposition. The portion of this substrate support on which the substrate (or wafer) is mounted is formed at least partially of a graphite material covered with a tantalum carbide (TaC) film, and the portion of the substrate support surrounding that portion is formed of a graphite material covered with a silicon carbide (SiC) film.

It is common that the graphite material of a substrate support is covered with an SiC film, since if the graphite material is exposed, it degasses, releasing boron, etc., which alters the ambient gas atmosphere around the substrate. However, it has been found in some cases that the portion of SiC film that has been brought into contact with the substrate particularly heats up to a high temperature and undergoes close-space sublimation. This close-space sublimation problem can be avoided by covering the graphite material with a TaC film, which has a higher melting point than an SiC film and has excellent heat tolerance and chemical stability, so that the substrate comes into contact with the TaC film.

It has been found, however, that TaC films are liable to crack and peel off, exposing the underlying graphite material. Further, both SiC and TaC films do not adequately adhere to graphite material and hence are likely to peel away from the graphite material. Therefore, prior art substrate supports covered with these films have the problem of low durability.

SUMMARY OF THE INVENTION

The present invention has been made to solve the above problems. It is, therefore, an object of the present invention to provide a substrate support which does not affect the ambient gas around the substrate and which has a long service life. Another object of the invention is to provide a semiconductor manufacturing apparatus provided with such a substrate support.

The features and advantages of the present invention may be summarized as follows.

According to one aspect of the present invention, a substrate support for supporting a substrate when forming a film on a surface of the substrate by means of chemical vapor deposition, the substrate support includes a graphite material having a recessed portion for accommodating the substrate, a multilayer film formed on the recessed portion and consisting of a first degassing prevention film of SiC and a first sublimation prevention film of TaC or HfC stacked together, and a second degassing prevention film of SiC formed on portions of the graphite material other than the recessed portion.

According to another aspect of the present invention, a substrate support for supporting a substrate when forming a film on a surface of the substrate by means of chemical vapor deposition, the substrate support includes a graphite material having a recessed portion for accommodating the substrate, and a multilayer film consisting of given numbers of alternating degassing prevention films of SiC and sublimation prevention films of TaC or HfC, the alternating degassing prevention films and sublimation prevention films being formed on top of one another and covering the graphite material.

According to another aspect of the present invention, a semiconductor manufacturing apparatus includes a substrate support for supporting a substrate when forming a film on a surface of the substrate by means of chemical vapor deposition, the substrate support having a graphite material having a recessed portion for accommodating the substrate, a multilayer film formed on the recessed portion and consisting of a first degassing prevention film of SiC and a first sublimation prevention film of TaC or HfC stacked together, and a second degassing prevention film of SiC formed on portions of the graphite material other than the recessed portion.

According to another aspect of the present invention, a semiconductor manufacturing apparatus includes a substrate support for supporting a substrate when forming a film on a surface of the substrate by means of chemical vapor deposition, the substrate support having a graphite material having a recessed portion for accommodating the substrate, and a multilayer film consisting of given numbers of alternating degassing prevention films of SiC and sublimation prevention films of TaC or HfC, the alternating degassing prevention films and sublimation prevention films being formed on top of one another and covering the graphite material.

Other and further objects, features and advantages of the invention will appear more fully from the following description.

DETAILED DESCRIPTION OF THE PREFERRED EMBODIMENTS

First Embodiment

Figure 1:
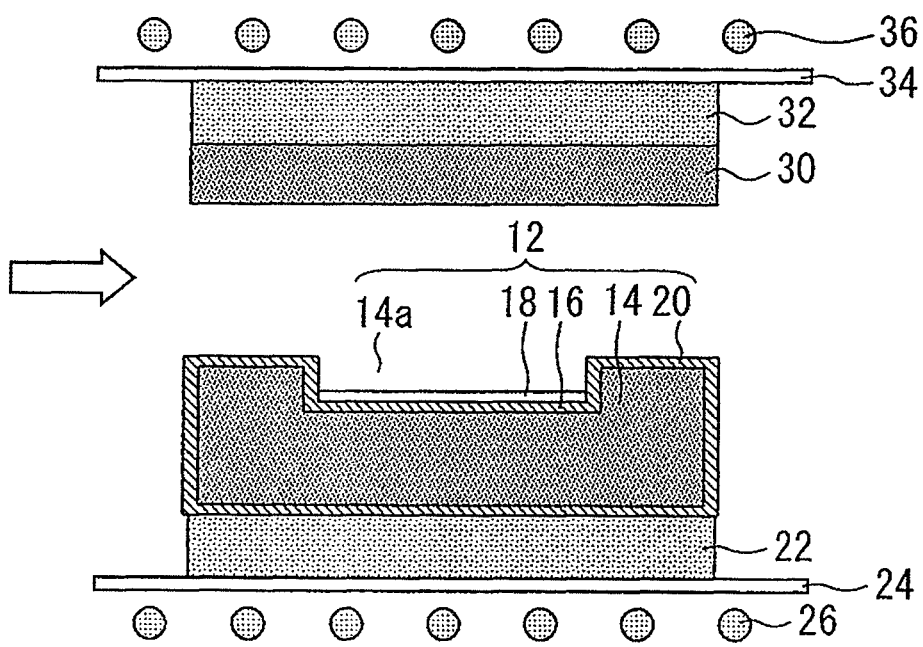
FIG. 1 is a diagram showing a vapor deposition apparatus in accordance with a first embodiment of the present invention.

FIG. 1 is a diagram showing a vapor deposition apparatus (or vapor phase epitaxy apparatus) in accordance with a first embodiment of the present invention. The vapor deposition apparatus 10 is provided with a substrate support 12. The substrate support 12 is used to support a substrate when forming a film on the surface of the substrate by means of chemical vapor deposition. The substrate support 12 includes a graphite material 14. The graphite material 14 has a recessed portion 14a for accommodating the substrate. As shown in FIG. 1, the recessed portion 14a is a hollow in the graphite body that does not penetrate entirely through the graphite material. In other words, the recessed portion 14a extends into and only part of the way through the graphite material. Therefore, the recessed portion 14a has a recess bottom surface that is closed, i.e., does not include any hole penetrating through the graphite material 14, and a recess side surface that is transverse to the recess bottom surface.

A first degassing prevention film 16 of SiC is formed on the recessed portion 14a. The first degassing prevention film 16 has a thickness of 100 μm. A first sublimation prevention film 18 of TaC or HfC is formed on the first degassing prevention film 16 located on the recessed portion 14a. The first sublimation prevention film 18 has a thickness of 30 μm. Thus, the recessed portion 14a of the graphite material 14 has formed thereon a multilayer film consisting of the first degassing prevention film 16 and the first sublimation prevention film 18 stacked together.

A second degassing prevention film 20 of SiC is formed on portions of the graphite material 14 other than the recessed portion 14a. The first degassing prevention film 16 and the second degassing prevention film 20 are integrally formed with each other. The surface of the substrate support 12 opposite the recessed portion 14a is secured to a securing member 24 with a heat insulating material 22 interposed therebetween. An RF coil 26 is provided outside the securing member 24.

A graphite material 30 is provided above the substrate support 12, and a flow path for reactive gas is defined between the graphite material 30 and the substrate support 12. The graphite material 30 is secured to a securing member 34 with a heat insulating material 32 interposed therebetween. An RF coil 36 is provided above the securing member 34.

A manufacturing method for the substrate support 12 will be described. First, SiC is deposited on the entire surface of the graphite material 14 having the recessed portion 14a. This forms the first degassing prevention film 16 and the second degassing prevention film 20 on the graphite material 14. Next, a masking member formed of graphite material is used to cover portions of the substrate support other than the recessed portion 14a. In this state, the first sublimation prevention film 18 of TaC or HfC is formed on the recessed portion 14a. Lastly, the mask member is retracted.

A deposition method (or film-forming method) using the vapor deposition apparatus 10 will be described. First, an SiC substrate is mounted in the recessed portion 14a. Next, the substrate support 12 and the graphite material 30 are heated to 1400° C. or more by means of RF heating using the RF coils 26 and 36. A material gas and a carrier gas are then caused to flow in the direction of the arrow of FIG. 1. The material gas is $SiH_4$ gas or $C_3H_8$ gas. The carrier gas is $H_2$ gas. As a result, the material gas on the SiC substrate decomposes so that an SiC semiconductor crystal is epitaxially grown on the SiC substrate.

When an SiC substrate is mounted in the recessed portion 14a of the substrate support 12 of the first embodiment, the SiC substrate is in contact with the first sublimation prevention film 18 of TaC or HfC, which is not liable to close-space sublimation. If the SiC substrate is in contact with the first degassing prevention film 16, as in the prior art, the first degassing prevention film 16 might undergo close-space sublimation.

It should be noted that TaC films and HfC films are liable to crack or peel off. However, the substrate support 12 of the first embodiment is configured in such a manner that the first degassing prevention film 16 of SiC underlies the first sublimation prevention film 18 of TaC or HfC, so that the graphite material 14 is not exposed even if the first sublimation prevention film 18 cracks. As a result, it is possible to prevent degassing of the graphite material 14. Further, the degree of adhesion between a film of TaC or HfC, such as the first sublimation prevention film 18, and a film of SiC, such as the first degassing prevention film 16, is higher than that between a film of TaC or HfC and a graphite material, meaning that it is possible to prevent peeling of the first sublimation prevention film 18 formed on the first degassing prevention film 16.

TaC films and HfC films are effective in avoiding the problem of close-space sublimation. However, since these films have a different coefficient of thermal expansion than the SiC film deposited on them, the deposited SiC film may detach itself from them and break into particles. In order to avoid this problem, the substrate support 12 of the first embodiment is configured in such a manner that the second degassing prevention film 20 of SiC, except for the portion overlying the recessed portion 14a, is exposed at the surface of the substrate support 12, thereby allowing the quantity of particles generated to be reduced.

As described above, the first embodiment makes it possible to prevent close-space sublimation, exposure of the graphite material, and generation of particles in the substrate support so that the substrate support does not affect the ambient gas around the substrate, thereby ensuring high quality vapor deposition, and so that the substrate support has an increased service life.

Various alterations may be made to the substrate support 12 of the first embodiment while retaining the above features. For example, the thicknesses of the first degassing prevention film 16, the first sublimation prevention film 18, and the second degassing prevention film 20 and the heating temperature provided by the RF coils 26 and 36 are not limited to the specific values given above.

Figure 2:
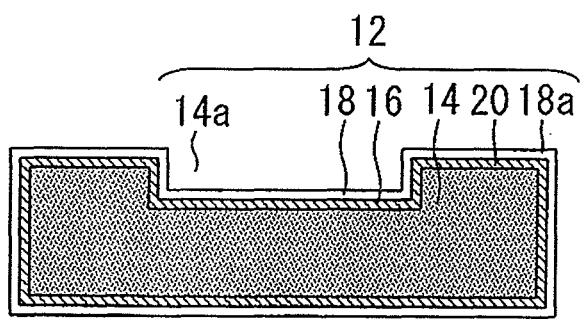
FIG. 2 is a diagram showing a variation of the substrate support of the first embodiment.

FIG. 2 is a diagram showing a variation of the substrate support of the first embodiment. The first sublimation prevention film 18 of TaC or HfC covers the first degassing prevention film 16 on the recessed portion 14a of this substrate support and is exposed to ambient atmosphere, as in the substrate support of the first embodiment. In addition, an extension portion 18a of the first sublimation prevention film 18 covers the second degassing prevention film 20 on portions of the substrate support other than the recessed portion 14a and is exposed to ambient atmosphere. The extension portion 18a, which is also formed of TaC or HfC, adequately adheres to the second degassing prevention film 20 of SiC and hence is unlikely to peel away from the second degassing film 20. The construction of this substrate support eliminates the need for the mask member described above which is used in the manufacturing process, making it possible to simplify the manufacturing process.

Second Embodiment

Figure 3:
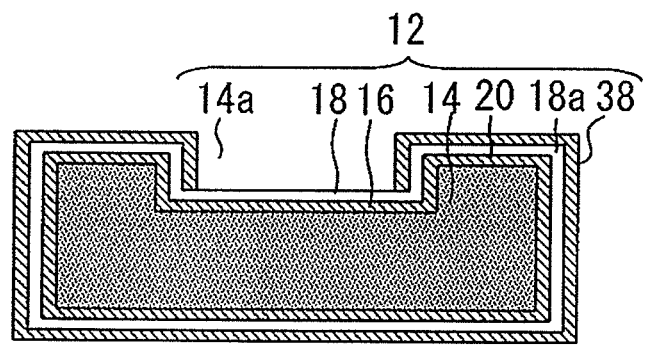
FIG. 3 is a diagram showing a substrate support in accordance with a second embodiment of the present invention.

FIG. 3 is a diagram showing a substrate support in accordance with a second embodiment of the present invention. Other components of the second embodiment are the same as those of the first embodiment and will not be described herein. The substrate support of the second embodiment is characterized in that a third degassing prevention film 38 of SiC is formed on the extension portion 18a of the first sublimation prevention film 18. Since the third degassing prevention film 38 is not formed on the recessed portion 14a, the first sublimation prevention film 18 is exposed at the surface of the recessed portion 14a.

Thus, in accordance with the second embodiment, the third degassing prevention film 38 covers portions of the substrate support 12 other than the recessed portion 14a (that is, covers the extension portion 18a), thereby minimizing generation of particles from the deposited SiC material.

Third Embodiment

Figure 4:
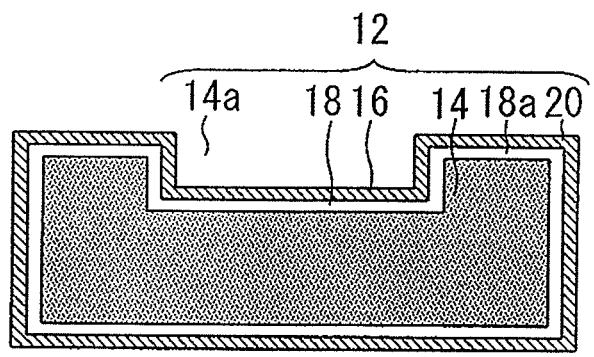
FIG. 4 is a diagram showing a substrate support in accordance with a third embodiment of the present invention.

FIG. 4 is a diagram showing a substrate support in accordance with a third embodiment of the present invention. Other components of the third embodiment are the same as those of the first embodiment and will not be described herein. In this substrate support of the third embodiment, the relative vertical positions of the first degassing prevention film 16 and the first sublimation prevention film 18 overlying the recessed portion 14a are reversed from those in the substrate support of FIG. 1. Specifically, the first degassing prevention film 16 is located on the first sublimation prevention film 18. Further, the extension portion 18a of the first sublimation prevention film 18 extends along and between the second degassing prevention film 20 and the graphite material 14, thus covering the graphite material 14. The first sublimation prevention film 18 has a thickness of 30 μm. The first degassing prevention film 16 and the second degassing prevention film 20 have a thickness of 100 μm.

When an SiC substrate is mounted in the recessed portion 14a, the first degassing prevention film 16 of SiC is in contact with the SiC substrate and therefore may undergo close-space sublimation. If a portion of the first degassing prevention film 16 undergoes close-space sublimation, the underlying first sublimation prevention film 18 is exposed through that portion. However, even in the extreme case, only the portion of the first sublimation prevention film 18 which lies directly below the SiC substrate is exposed, and the remaining portion of the first sublimation prevention film 18 is covered by the first degassing prevention film 16 and the second degassing prevention film 20, which are exposed to ambient atmosphere. Therefore, it is possible to minimize generation of particles from the material deposited on the first sublimation prevention film 18 of TaC or HfC.

Further, in the case of portions of the substrate support other than the recessed portion 14a, the second degassing prevention film 20 of SiC adheres to the extension portion 18a of TaC or HfC formed on the portions, so that the second degassing prevention film 20 does not peel off.

Figure 5:
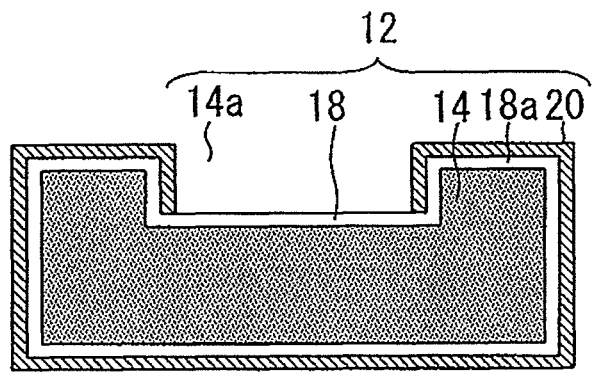
FIG. 5 is a diagram showing a variation of the substrate support of the third embodiment.

FIG. 5 is a diagram showing a variation of the substrate support of the third embodiment. This substrate support differs from that shown in FIG. 4 in that the first degassing prevention film is not formed on the first sublimation prevention film 18 located on the recessed portion 14a. Thus, in the substrate support of FIG. 5, the first sublimation prevention film 18 on the recessed portion 14a is exposed to ambient atmosphere, thereby avoiding close-space sublimation. Further, the second degassing prevention film 20 of SiC serves to prevent exposure of the graphite material 14 in portions of the substrate support other than the recessed portion 14a. In addition, the second degassing prevention film 20 of SiC adheres to the extension portion 18a of TaC or HfC formed on portions of the substrate support other than the recessed portion 14a, so that the second degassing prevention film 20 does not peel off.

Fourth Embodiment

Figure 6:
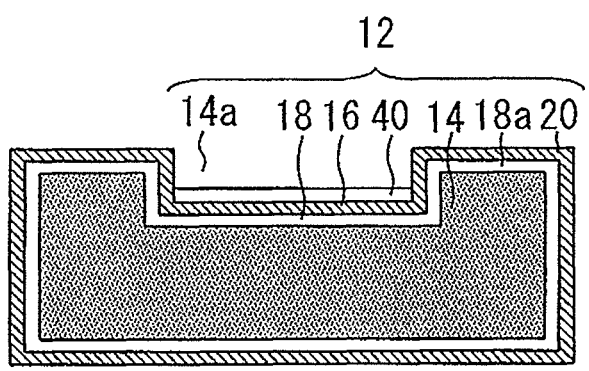
FIG. 6 is a diagram showing a substrate support in accordance with a fourth embodiment of the present invention.

FIG. 6 is a diagram showing a substrate support in accordance with a fourth embodiment of the present invention. Other components of the fourth embodiment are the same as those of the first embodiment and will not be described herein. The substrate support shown in FIG. 6 differs from that shown in FIG. 4 in that a second sublimation prevention film 40 of TaC or HfC is formed on the first degassing prevention film 16 located on the recessed portion 14a.

Thus, the second sublimation prevention film 40 is formed to cover the recessed portion 14a, thereby preventing close-space sublimation. It should be noted that since, as noted above, TaC films and HfC films are liable to crack or peel off, the second sublimation prevention film 40 may crack or peel off. If the second sublimation prevention film 40 cracks or peels off, the underlying first degassing prevention film 16 of SiC is exposed. The exposed first degassing prevention film 16 may undergo close-space sublimation. Even in such cases, however, the first sublimation prevention film 18 underlying the first degassing prevention film 16 serves to prevent exposure of the graphite material 14.

Fifth Embodiment

Figure 7:
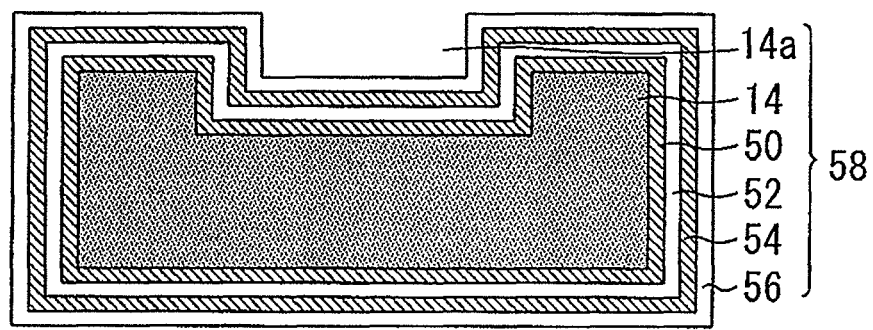
FIG. 7 is a diagram showing a substrate support in accordance with a fifth embodiment of the present invention.

FIG. 7 is a diagram showing a substrate support in accordance with a fifth embodiment of the present invention. Other components of the fifth embodiment are the same as those of the first embodiment and will not be described herein. The substrate support shown in FIG. 7 is provided with a multilayer film 58 consisting of given numbers of alternating degassing prevention films of SiC and sublimation prevention films of TaC or HfC. These alternating prevention films are stacked on top of one another and cover the graphite material 14.

In the fifth embodiment, the multilayer film 58 includes a degassing prevention film 50, a sublimation prevention film 52, a degassing prevention film 54, and a sublimation prevention film 56 formed on top of one another on the graphite material 14, in that order. The degassing prevention films 50 and 54 have a thickness of 40 μm. The sublimation prevention films 52 and 56 have a thickness of 10 μm.

Thus, the sublimation prevention film 56 constitutes the top surface layer of the multilayer film 58, thereby preventing close-space sublimation on the recessed portion 14a. Further, the multilayer film structure of the substrate support enhances prevention of peeling of films, making it possible to increase the service life of the substrate support. It should be noted that the substrate supports described in the first to fifth embodiments may be used as components of various semiconductor manufacturing apparatuses.

The features and advantages of the present invention may be summarized as follows. Since the substrate supports of the present invention are configured as a graphite material covered at least partially with a multilayer film, they do not affect the ambient gas around the substrate mounted thereon and have a long service life.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-129717, filed on Jun. 7, 2012/including specification, claims, drawings/and summary, on which the Convention priority of the present application is based, is incorporated herein by reference in its entirety.

What is claimed is:

1. A substrate support for supporting a substrate when forming a film on a surface of the substrate by chemical vapor deposition, the substrate support comprising: a graphite body having top, bottom, and side surfaces, and a recess extending into and through only part of the graphite body, at the top surface of the graphite body, for accommodating the substrate, wherein the recess includes a closed recess bottom surface and a recess side surface that is transverse to the closed recess bottom surface; a coating of SiC completely covering the graphite body on the top, bottom, and side surfaces and covering the closed recess bottom surface and the recess side surface; and a sublimation prevention film selected from the group consisting of TaC and HfC, located in the recess, and covering the coating of SiC in the recess, opposite the closed recess bottom surface, wherein the coating of SiC on the closed recess bottom surface is sandwiched between the graphite body and the sublimation prevention film in the recess, and the sublimation prevention film is exposed for contacting the substrate when the substrate is accommodated in the recess.

2. The substrate support according to claim 1, wherein the sublimation prevention film is HfC.

3. The substrate support according to claim 1, wherein the sublimation prevention film completely covers the coating of SiC.

* * * * *